United States Patent [19]

Maruyama et al.

[11] 4,121,537
[45] Oct. 24, 1978

[54] APPARATUS FOR VACUUM DEPOSITION

[75] Inventors: Eiichi Maruyama, Kodaira; Tadaaki Hirai, Koganei; Sachio Ishioka, Tokyo; Hideaki Yamamoto; Kiyohisa Inao, both of Hachioji, all of Japan

[73] Assignee: Hitachi, Ltd., Japan

[21] Appl. No.: 779,795

[22] Filed: Mar. 21, 1977

[30] Foreign Application Priority Data

Mar. 19, 1976 [JP] Japan .................. 51/29234

[51] Int. Cl.$^2$ .................. B05C 11/00; C23C 13/08
[52] U.S. Cl. .................. 118/7; 118/49.1
[58] Field of Search .................. 118/7, 8, 49.1, 49.5

[56] References Cited

U.S. PATENT DOCUMENTS

| | | | |
|---|---|---|---|
| 3,382,842 | 5/1968 | Steckelmacher et al. | 118/8 |
| 3,732,846 | 5/1973 | Lukaszek et al. | 118/49.1 X |
| 3,800,738 | 4/1974 | Tassara | 118/8 |
| 3,939,798 | 2/1976 | Morton | 118/7 |
| 4,024,291 | 5/1977 | Wilmanns | 118/8 X |
| 4,059,067 | 11/1977 | Lardon et al. | 118/9 X |

FOREIGN PATENT DOCUMENTS 1,003,378 9/1965 United Kingdom .................. 118/7

*Primary Examiner*—Wm. Carter Reynolds
*Attorney, Agent, or Firm*—Craig & Antonelli

[57] ABSTRACT

An apparatus for vacuum deposition comprising a turn-table for holding substrates for deposition, and a plurality of evaporation boats arranged in opposition to a circumferential part of the turn-table, the turn-table being rotated at deposition whereby vapors from the respective boats can be cyclically accumulated and stuck onto the substrates, further comprises at least one film-thickness monitor which is fixed to the turn-table and which detects the quantity of a deposited substance of one layer stuck every time the substrates pass over each boat, and means to receive a signal from the film-thickness monitor and divide the signal time sequentially, thereby detecting at least one of the deposition rate and the total amount of the vapor from each boat, and to control the quantity of the vapor arriving to the substrates for deposition from each boat while comparing the detected value with a predetermined value.

6 Claims, 5 Drawing Figures

APPARATUS FOR VACUUM DEPOSITION

BACKGROUND OF THE INVENTION

1. Field of the Invention

This invention relates to an apparatus for vacuum deposition which arbitrarily controls the components of a film to be formed by deposition and having component elements of different vapor pressures and which produces the deposited film having a component ratio or a gradient thereof as desired.

2. Description of the Prior Art

Heretofore, in fabricating a vacuum deposited layer of a compound consisting of two or more kinds of elements, the expedient of flashing evaporation or co-evaporation employing a plurality of boats has been adopted in order to prevent the deviation of the composition ascribable to the fact that the vapor pressures of the component elements are different. The flashing evaporation is a method wherein a raw material is dropped bit by bit into a boat heated to a high temperature and the dropped bits are vaporized in a short time. With this method, the deviation of the quantities of the component elements from predetermined values is comparatively small. The method, however, is disadvantageous in that defects are prone to occur in the deposited film because the raw material is fused and vaporized abruptly. Besides, it is difficult to satisfy the requirement that the component ratio of the deposited film be changed continuously in the direction of the film thickness.

The coevaporation from the plurality of boats enables to arbitrarily select the components of the deposited film. Since, however, the distances from the respective boats to various points on a substrate for deposition are not equal, the composition ratio becomes non-uniform at various parts of the surface of the deposited film.

In U.S. Pat. No. 3,800,194 is proposed a method which resembles the cyclically accumulating a large number of thin layers of respective components. According to this method, vapor flows from a plurality of vaporization sources are measured and controlled by using an ionization type gauge or a film-thickness monitor, and a film having a desired composition ratio is obtained by the rotary deposition method. The method, however, is disadvantageous in that since a probe for measuring the deposition rate or the deposited film thickness is not situated at a position identical to that of a substrate for deposition, the quantity of the substance actually deposited onto the substrate for deposition and the quantity of vaporization detected by the probe do not always correspond precisely.

SUMMARY OF THE INVENTION

It is an object of this invention to eliminate the above-mentioned disadvantages and to provide an apparatus for vacuum deposition which, relying on the multi-source rotary deposition, detects the quantity of deposition and the deposition rate of each component by a film-thickness monitor and controls the composition ratio in the direction of the film thickness highly accurately, thereby to produce a deposited film having a composition profile as desired.

In order to accomplish the object, in the apparatus for vacuum deposition according to this invention, at least one film-thickness monitor, which is fixed to a turn-table and which serves to hold substrates for deposition, measures in succession the thicknesses of thin layers successively deposited from respective evaporation boats and feeds them in the form of an electrical signal to a control unit, and the control unit divides and redistributes the film-thickness information thus obtained in time sequence into film-thickness information based on deposited substances from the respective boats, detects at least one of the deposition rate and the quantity of deposition for each boat and controls the quantities of vapors arriving to the substrates for deposition from the respective boats while comparing the detected values with corresponding values in a preset deposition program.

In one aspect of performance of this invention, the control of the vapor quantities arriving to the substrates for deposition from the respective boats is carried out in such a way that the control unit controls at least one of heating currents for the respective boats and the sizes of openings which are defined between shutters and slits provided in shields intervening between the boats and the substrates for deposition.

In another aspect of performance of this invention, the respective boats have film-thickness monitors associated therewith on at least one film-thickness monitor fixed to the turn-table at a position between the boats and the shutters detects directly quantities of vaporizations from the corresponding boats and the signals from the film-thickness monitors are fed back to boat power sources so as to keep the quantities of vaporization from the boats constant and the control of the vapor quantities arriving to the substrates for deposition from the respective boats is carried out in such a way that the control unit controls the sizes of openings which are defined between shutters and slits provided in shields intervening between the boats and the substrates for deposition.

While this invention will be hereunder described more in detail in connection with embodiments with reference to the accompanying drawing, they are merely for exemplification, and various modifications and improvements can of course be made without departing from the scope of this invention.

DESCRIPTION OF THE PREFERRED EMBODIMENTS

EXAMPLE 1

Figure 1A:
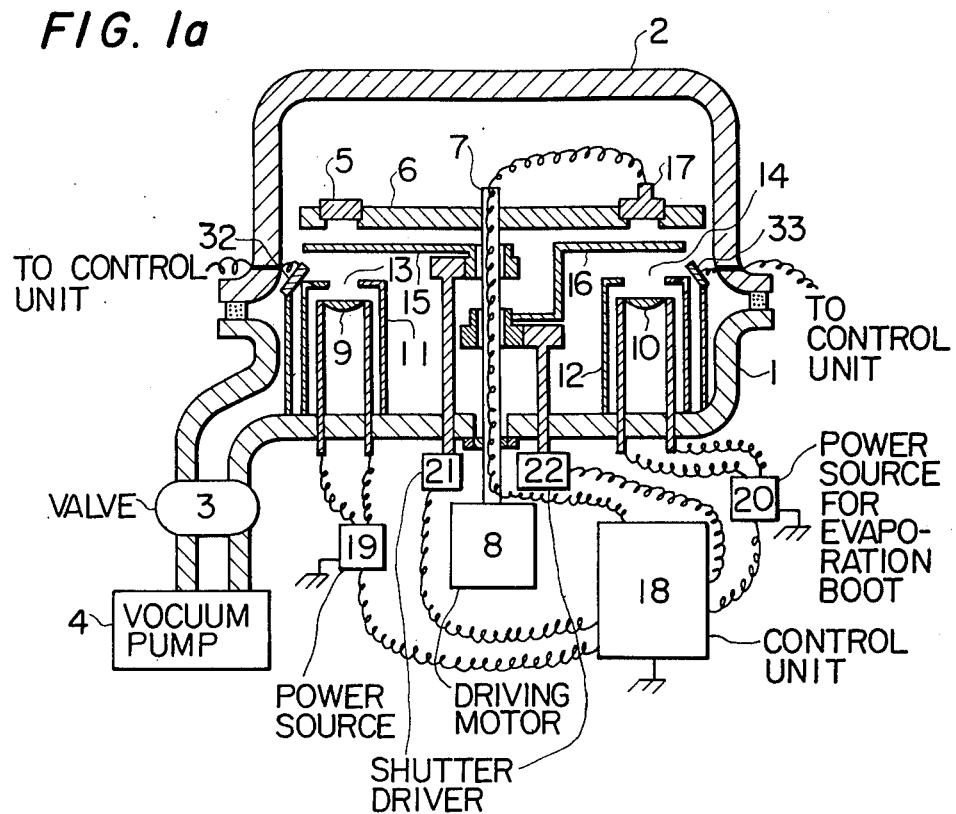
FIG. 1a is a view illustrating the principle of the apparatus of this invention.
Figure 1B:
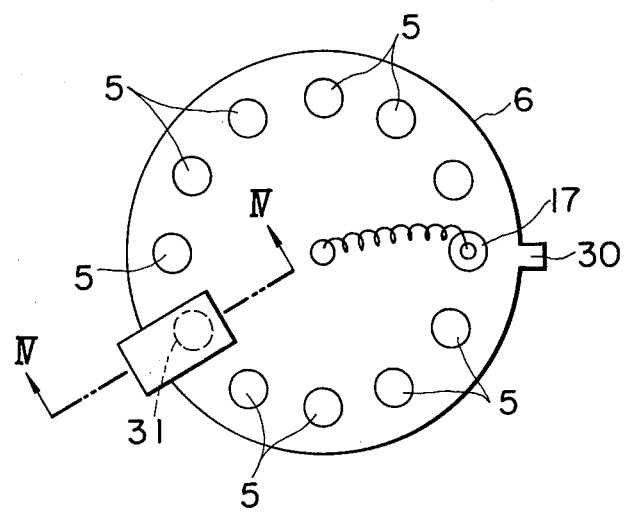
FIG. 1b is a plan view of a turn-table employed in the apparatus of FIB. 1a, FIG. 2 is a diagram illustrating a method for time sequential division as used in the apparatus of this invention.

FIG. 1a is a view which illustrates the principle of an apparatus according to this invention. A base 1 and a bell jar 2 form a vacuum chamber of the apparatus. The chamber is connected to a vacuum pump 4 through a valve 3. Substrates for deposition 5 are placed on a turn-table 6, which is rotated by a rotary shaft 7 and a driving motor 8. With the rotation of the turn-table 6, the substrates for deposition 5 on the turn-table 6 pass over evaporation boats 9 and 10, and vapors from the boats are cyclically accumulated thereon. The vapors from the evaporation boats 9 and 10 are stopped by shields 11 and 12 except for the parts proceeding in specific directions so that the contamination of the vacuum vessel 1 and 2 is prevented. Regarding the vapors towards the turn-table 6, the quantities to be deposited on the substrate 5 per unit time can be controlled by controlling the sizes of openings which are defined by slits 13 and 14 provided in the respective shields 11 and 12 and externally drivable shutters 15 and 16. In order to measure the quantities deposited on the substrates 5, a crystal film-thickness monitor 17 is disposed at a position on the turn-table 6 which is identical to those of the substrates for deposition 5, and the thickness of the deposited layer can be externally measured via a lead passing through the rotary shaft 7. A signal from the film-thickness monitor 17 enters a control unit 18. Herein, whether or not a preset deposition program and the actual film-thickness information are in accordance is judged. The result of judgment is converted into a control information, with which power sources 19 and 20 corresponding to the evaporation boats 9 and 10 respectively or shutter drivers 21 and 22 corresponding to the shutters 15 and 16 respectively are controlled. Thus, the quantities of depositions from the respective evaporation boats to the substrates 5 can be controlled. FIG. 1b is a plan view of the turn-table 6, and illustrates the positional relationship between the substrates for deposition 5 and the crystal film-thickness monitor 17. In the figure, numeral 30 designates a protuberance which gives the mark point of the rotation.

Figure 2:
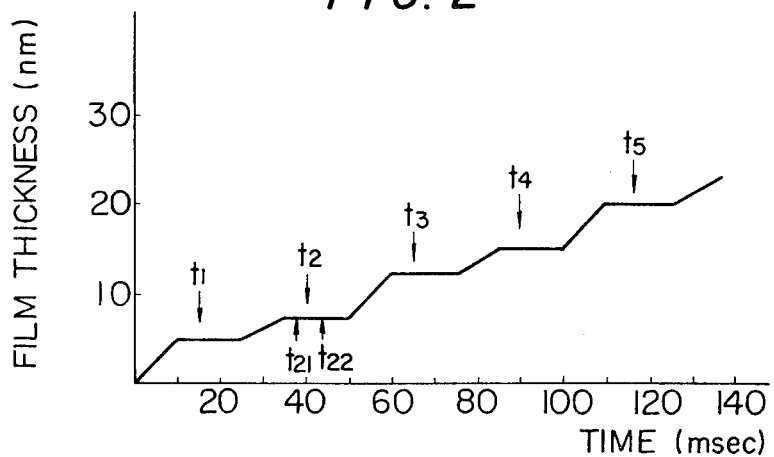

FIG. 2 illustrates variations of the thickness of the multilayer film deposited by the rotary deposition apparatus versus time. Assuming now that substances A and B are simultaneously vaporized from the evaporation boats 9 and 10 respectively, when the turn-table 6 is rotated at fixed speed, the thickness of the film deposited onto the substrate 5 undergoes the variations as shown in FIG. 2. That is, when the substrate 5 stays over the evaporation boat 9, the film thickness increases by the deposition of the substance A, when it stays over the evaporation boat 10, the film thickness increases by the deposition of the substance, B, and when it stays over neither of the boats, the film thickness is held constant. In case where the two kinds of boats are involved as in the present example, the deposited film should be a multilayer film constructed by the cyclic accumulation of the two sorts of layers as A, B, A, B . . . . Accordingly, the thicknesses of the layers deposited from the respective boats during one revolution of the turn-table 6 can be known by dividing the time sequential film-thickness information obtained from the single film-thickness monitor 17 as shown in FIG. 2. Suppose by way of example that the film thicknesses are measured at times $t_1$, $t_2$, $t_3$ . . . and respective measured values are $T(t_1)$, $T(t_2)$, $T(t_3)$ . . . . . Then, the respective film thicknesses are measured in the following manner:

$T(t_2) - T(t_1) = A_1$ represents the thickness of the first layer of the substance A, $T(t_3) - T(t_2) = B_1$ represents the thickness of the first layer of the substance B, $T(t_4) - T(t_3) = A_2$ represents the thickness of the second layer of the substance A, $T(t_5) - T(t_4) = B_2$ represents the thickness of the second layer of the substance B, . . . . Accordingly, the total film thicknesses and the deposition rates can also be known in such a manner that $A = A_1 + A_2 + \ldots$ indicates the total film thickness of only the substance A, while $B = B_1 + B_2 + \ldots$ indicates the total film thickness of only the substance B, and that $A_1/(t_2 - t_1)$ denotes the deposition rate of the substance A near the time $t_1$, while $B_1/(t_3 - t_2)$ denotes the deposition rate of the substance B near the time $t_2$. Although, for the sake of brevity, the above explanation has been done by assuming the number of the boats of the simultaneous evaporations to be two, it is to be understood that the present method is, in principle, applicable even in case where depositions are simultaneously carried out from a large number of evaporation boats insofar as the boats can be disposed along the circumference of the turn-table. Although, in the above explanation, it has been assumed that only one crystal film-thickness monitor 17 is comprised, another crystal film-thickness monitor 31 fixed to the turn-table 6 may be added and disposed at a position between boats 9 and 10 and the shutters 15 and 16 so that vapor flows which are not checked by the latter are monitored at all times. Thus, the quantities of vaporizations from the respective boats can be monitored independently of the position of the shutters by procedures similar to those described above. As an alternative method for keeping the quantities of vaporizations constant, fixed film-thickness monitors 32 and 33 associated with the respective boats are disposed in the vacuum chamber and the currents of the evaporation boats are controlled while continually monitoring vaporization rates independently of the rotation of the turn-table 6.

Figure 3:
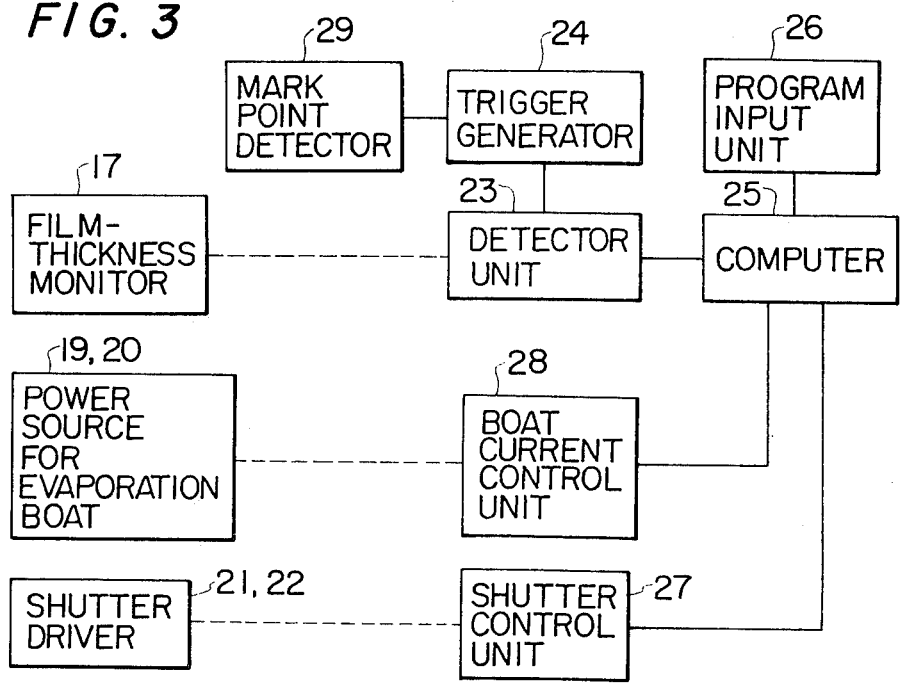
FIG. 3 is a block diagram illustrating the principle of a control unit used for this invention.
Figure 4:
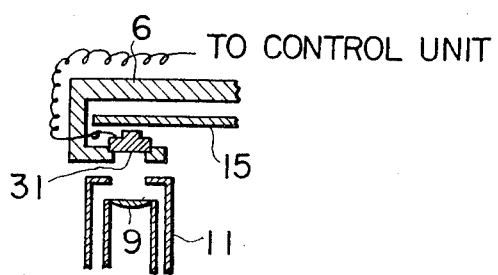
FIG. 4 is a sectional view of the apparatus of this invention as taken along line IV—IV in FIG. 1b.

FIG. 3 is an example of a block diagram illustrating the constructional principle of the control unit 18. Since the film-thickness is detected as variations of the oscillating frequency of an oscillator crystal, a detector unit 23 for detecting it is provided. The detector unit 23 executes the measurement of the film thickness upon receiving a signal from a trigger generator 24 which determines the timing of the detection (for example, an initial point $t_{21}$ and a terminal point $t_{22}$ for the time $t_2$) in synchronism with the rotation of the turn-table 6. Shown at 29 is a detector for the mark point 30. The film-thickness information is fed to a computer 25, in which the quantity of deposition from each boat is calculated. The quantity of deposition is compared with a program from a program input unit 26, and the result is fed to a shutter control unit 27 and a boat current control unit 28 so as to control the opening angle of the shutter and the boat current.

This invention relates, in principle, to a method for fabricating a multilayer film. In practical use, it is especially useful in case of fabricating a thin film which contains several kinds of elements of different vapor pressures at arbitrary component ratios. In that case, the components should desirably be mixed as uniformly as possible, and hence, the thickness of one layer of one component should desirably be 10 nm or below. A deposited film in which a large number of thin layers of such thicknesses are accumulated and which has a total film thickness of 1 $\mu$m or above can be regarded as a uniform material both electrically and optically.

Hereunder, an example of use of the apparatus according to this invention will be explained on a case of fabricating a thin film consisting of 90 atomic-% Se and 10 atomic-% As. A tantalum boat filled with Se is employed as the evaporation boat 9 in FIG. 1a, and a tantalum boat filled with As as the evaporation boat 10. The vacuum chamber indicated by 1 and 2 is evacuated to a pressure of $1 \times 10^{-6}$ Torr. The turn-table 6 is rotated at a speed of 100 rpm. Currents flow through the boats 9 and 10, and when vaporizations of substantially constant rates have begun, the shutters 15 and 16 are opened to commence depositions. Using deposition rate information obtained by decomposing a signal from the film-thickness monitor in time sequence, the control unit 18 is operated to control the opening angle of the shutters 15 and 16 so that the weight ratio of Se and As to be deposited may become 9:1 in terms of the atomic ratio. In case where the deposition quantities cannot be controlled within the control ranges of the shutters, the control of the evaporation boat currents is used together. Thus, deposited layers in which one layer of each element is about 1 nm thick are cyclically accumulated to obtain a film of desired thickness.

EXAMPLE 2

A thin film of a total thickness of 4 μm in which Se, As and Te have a specified composition profile in the direction of the film thickness is fabricated. Three tantalum boats are respectively filled with Se, $As_2Se_3$ and Te, and are arranged in the apparatus for deposition. By associated film-thickness monitors fixed to the respective boats, the boat currents are controlled so that the respective components may be vaporized with predetermined rates from the boats during the deposition operation. As in Example 1, the turn-table is rotated at the speed of 100 rpm, and the sizes of the opening defined by the shutters and the slits are program-controlled so as to bring the deposited quantities of the respective components into the desired composition profile. The actual quantities of depositions from the respective boats are evaluated in such a way that a signal from the film-thickness monitor fixed to the turn-table is divided in time sequence and subjected to the calculation by the computer. The values thus obtained are compared with a program so as to compensate the opening angles of the shutters. The quantities of vaporizations are controlled so that the thickness of one layer of each component may become 5 nm or below, and the depositing operation is completed when the total thickness has reached 4 μm.

As apparent from the above examples, this invention can arbitrarily and precisely control the composition profile within a thin film in case of fabricating the thin film made of a plurality of elements of different vapor pressures. As previously stated, if the thickness of one layer from each evaporation boat is smaller than 10 nm a thin film thus obtained can be regarded as a material in which the components are mixed substantially uniformly, and if the thickness of one layer is greater than several tens of nm, the thin film demonstrates the performance of a deposited multilayer film of substances of different properties as in an interference filter. Accordingly, the thin film formed by such a method is applicable to multifarious fields including, for example, an image pickup tube target, a light receptor such as solid state sensor and an optical component such as interference filter, in dependence on the components employed. The device according to this invention gives also excellent uniformity within the plane of the film and good reproducibility.

What is claimed is:

1. An apparatus for vacuum deposition, comprising:
   a vacuum chamber which is connected to a vacuum pump,
   a turn-table which is mounted in said vacuum chamber and which is rotated by a driving motor,
   substrates for deposition which are arranged at a circumferential part of said turn-table,
   a plurality of evaporation boats which are disposed so as to oppose said substrates for deposition,
   means for heating said evaporation boats,
   at least one film-thickness monitor which is fixed to said turn-table and which detects a quantity of a substance deposited onto it every time it passes-over each of said plurality of evaporation boats, said substrates and said film-thickness monitor passing-over each of said plurality of evaporation boats during rotation of said turn-table, and
   means to receive a signal from said film-thickness monitor and divide said signal in time sequence, thereby detecting a value for at least one of a deposition rate and a total amount of a vapor from each of said boats, and to control a quantity of the vapor arriving to said substrates for deposition from each of said boats while comparing the detected value with a predetermined value given by a preset deposition program,
   whereby the vapors from the respective boats are cyclically accumulated and stuck onto said substrates for deposition so as to conform with said preset deposition program.

2. An apparatus for vacuum deposition according to claim 1, comprising:
   shields which intervene between said boats and said substrates for deposition and which are provided with slits,
   shutters, and
   means to control sizes of openings defined by said shields and said shutters, thereby controlling the quantities of said vapors arriving to said substrates for deposition from said respective boats.

3. An apparatus for vacuum deposition according to claim 1, wherein said means to control the quantity of said vapor arriving to said substrates for deposition from each of said boats controls said means for heating said evaporation boat, thereby controlling said quantity of said vapor arriving to said substrates for deposition from each of said boat.

4. An apparatus for vacuum deposition according to claim 2, wherein said means to control the quantity of said vapor arriving to said substrates for deposition from each of said boats controls said means for heating said evaporation boat, thereby controlling said quantity of said vapor arriving to said substrates for deposition from said each boat.

5. An apparatus for vacuum deposition according to claim 2, wherein in addition to said at least one film-thickness monitor fixed to said turn-table, said respective boats have other film-thickness monitors associated therewith and serving to directly detect quantities of vaporizations from the corresponding boats, and the signals from said film-thickness monitors are fed back to said means for heating said evaporation boats, so as to keep the quantities of vaporizations from said boats constant.

6. An apparatus for vacuum deposition according to claim 2, wherein said at least one film-thickness monitor is fixed to said turn-table at a position between said boats and said shutters where it detects directly quantities of vaporizations from the corresponding boats, and the signals from said at least one film-thickness monitor detecting directly the quantities of vaporization are fed back to said means for heating said evaporation boats, so as to keep the quantities of vaporizations from said boats constant.

* * * * *